United States Patent [19]
Somasekhar et al.

[11] Patent Number: 6,002,272
[45] Date of Patent: Dec. 14, 1999

[54] TRI-RAIL DOMINO CIRCUIT

[75] Inventors: Dinesh Somasekhar, Lafayette, Ind.; Vivek De, Hillsboro, Oreg.

[73] Assignee: Intel Corporation, Santa Clara, Calif.

[21] Appl. No.: 08/997,071

[22] Filed: Dec. 23, 1997

[51] Int. Cl.$^6$ .................. H03K 19/096; H03K 19/0948
[52] U.S. Cl. .............................. 326/98; 326/17; 326/34; 326/121
[58] Field of Search ............................ 326/93, 95, 98, 326/112, 119, 121, 17, 31, 33–34, 68, 80–81

[56] References Cited

U.S. PATENT DOCUMENTS 4,896,057  1/1990  Yang et al. .......................... 326/116
5,486,774  1/1996  Douseki et al. ....................... 326/33

Primary Examiner—Jon Santamauro
Attorney, Agent, or Firm—Blakely, Sokloff, Taylor & Zafman LLP

[57] ABSTRACT

A domino logic circuit includes a clocked precharge stage coupled to a positive voltage rail with the precharge stage having an input. An evaluation network adapted to receive at least one input is coupled between the precharge stage and a common voltage rail. A static CMOS stage is coupled to the positive voltage rail, and includes an input and an output, the input being coupled to a junction formed by the precharge stage and the evaluation network. A negative voltage rail is coupled to the static CMOS stage to precharge the output negative.

21 Claims, 4 Drawing Sheets

TRI-RAIL DOMINO CIRCUIT

BACKGROUND OF THE INVENTION

1. Field of the Invention

The invention relates generally to logic circuits, and more specifically, to a domino circuit topology for use with low threshold voltage devices.

2. Description of Related Art

Logic systems implemented in complimentary metal oxide semiconductor (CMOS) devices are widely used in many types of computing systems. A useful semiconductor integrated logic circuit is known as "Domino," which is described in detail, for example, in a paper by R. H. Krambeck, et al. entitled "High-Speed Compact Circuits with CMOS," IEEE J. Solid-State Circuits, vol. SC-17, pp. 614–619 (1982).

In general, a domino circuit comprises a collection of logic gates, at least some of which deliver logic signals as logic input signals to other gates. This entire circuit is periodically activated by a single clock edge during each period. FIG. 1 illustrates a typical prior art domino circuit 10. The prior art domino circuit 10 includes a clocked positive-channel metal oxide semiconductor (PMOS) precharge transistor 12 coupled between a voltage source $V_{cc}$ and an evaluation network 13 that may or may not be clock gated. In a typical domino circuit, the evaluation network 13 comprises a plurality of NMOS transistors arranged to perform a given logic function. The evaluation network 13 essentially functions as a switch that may close to establish a path to $V_{ss}$ in response to a plurality of inputs provided thereto. In FIG. 1, the evaluation network is illustrated symbolically as a single negative-channel metal oxide semiconductor (NMOS) transistor 14 coupled to an input 15.

The NMOS evaluation transistor 14 is coupled to a common voltage rail $V_{ss}$ that is tied to the device substrate (indicated by a ground connection 16 on the $V_{ss}$ line). A CMOS stage 18 is coupled to a dynamic node 20 formed at the junction of the NMOS evaluation transistor 14 and the precharge transistor 12. The static CMOS stage 18 comprises a PMOS transistor 22 and an NMOS transistor 24 coupled in series to form an inverter. An output terminal 26 of the static CMOS stage 18 may be coupled to the input of a succeeding domino gate's evaluation network 28. Further, a "keeper" circuit 29 may to be employed to hold the state of the dynamic node 20. In FIG. 1, the keeper circuit comprises an inverter 30 and a PMOS transistor 32.

Each clock period includes a precharge phase that establishes the output terminal 26 at a predetermined logic level, and an evaluate phase, where the input terminals 15 coupled to the evaluation network 13 are evaluated. The precharge phase occurs when the clock is low. The low clock turns on the precharge transistor 12, precharging the dynamic node 20 logically high, and in turn, discharging the output 26 terminal through the NMOS transistor 24. Hence, the output 26 terminal is precharged logically low.

The evaluation phase occurs when the clock goes high. The high clock turns off the precharge transistor 12. If the input terminals 15 to the evaluation network 13 are configured such that a path to $V_{ss}$ is established, the logic high at the dynamic node 20 will discharge through the evaluation network 13. The evaluation network 13 is illustrated symbolically in FIG. 1 as the NMOS evaluation transistor 14. Thus, if the input terminal 15 to the NMOS evaluation transistor 14 is at a logically high level, the NMOS evaluation transistor 14 will turn on and provide a discharge path to $V_{ss}$ for the dynamic node 20. This will turn the NMOS transistor 24 off and turn the PMOS transistor 22 on, resulting in the output terminal 26 evaluating at logic high. If the input terminal 15 is at a logically low level, the NMOS evaluation transistor 14 remains off, and does not establish a discharge path to $V_{ss}$. In this situation, the dynamic node 20 and the output terminal 26 remain at their precharge levels during the evaluation phase.

In FIG. 1, the output terminal 26 is shown coupled to the input of a succeeding domino gate's evaluation network 28. Typically, several domino gates are cascaded in this manner, so that each gate commutes its prescribed logic function during the evaluate phase that occurs once per clock period. Thus, when the circuit is clocked, each gate commutes its prescribed function, one after another, analogously to the falling of a series of dominos. Like dominos, once the dynamic node 20 "falls" (evaluates to a logic low), it stays "fallen" until it is "picked up" by the precharge phase of the next cycle.

Domino logic gates provide several advantages over static CMOS gates, including higher speed and smaller area. However, subthreshold leakage currents and noise immunity at the input terminals are concerns with known domino circuits. Further, scaling supply voltages is attractive for improving device performance and reducing overall system power requirements. While scaling threshold voltages benefits static CMOS gates, the noise immunity of domino gates is adversely affected.

As threshold voltages of circuit components are reduced, domino designs become increasingly difficult to achieve. Reduced threshold voltages result in increased leakage current, which in turn, may adversely affect power consumption. During the precharge stage, the dynamic node 20 is precharged high and the output terminal 26 is precharged low. Prior to the start of the evaluation mode, the domino logic gate 10 is in a standby mode with the dynamic node 20 and the output terminal 26 held at their precharge levels essentially by the NMOS evaluation transistor 14 and the PMOS transistor 22, respectively. The dynamic node 20 precharge level is further maintained by the keeper circuit 29. In the standby mode, static power consumption is limited to the leakage current of the NMOS evaluation transistor 14 and the PMOS transistor 22. The inverter 30 in the keeper circuit 29 is typically small and any leakage therein can be ignored. Moreover, scaling threshold voltages results in a reduced noise margin at the input of the NMOS evaluation transistor 14. This could cause the NMOS evaluation transistor 14 to switch on for smaller noise spikes at the input terminal 15, causing an unwanted discharge of the dynamic node 20.

Maintaining high threshold voltages to allow the continued use of standard domino gates may not be a viable option as this would degrade the performance of static CMOS, and prevent further reduction of supply voltages. Nevertheless, domino continues to be attractive for very high speed circuits on a chip, for example, along critical timing paths.

Thus, a need exists for a domino circuit topology that allows the use of domino circuit styles in low threshold voltage processes. The present invention addresses the above described and other shortcomings of the prior art.

SUMMARY OF THE INVENTION

In one aspect of the invention, a domino circuit includes a clocked precharge stage coupled to a positive voltage rail with the precharge stage having an input. An evaluation network adapted to receive at least one input is coupled between the precharge stage and a common voltage rail. A static CMOS stage is coupled to the positive voltage rail, and includes an input and an output, the input being coupled to a junction formed by the precharge stage and the evaluation network. A negative voltage rail is coupled to the static CMOS stage to precharge the output negative.

BRIEF DESCRIPTION OF THE DRAWINGS

Other objects and advantages of the invention will become apparent upon reading the following detailed description and upon reference to the drawings in which.

Figure 1:
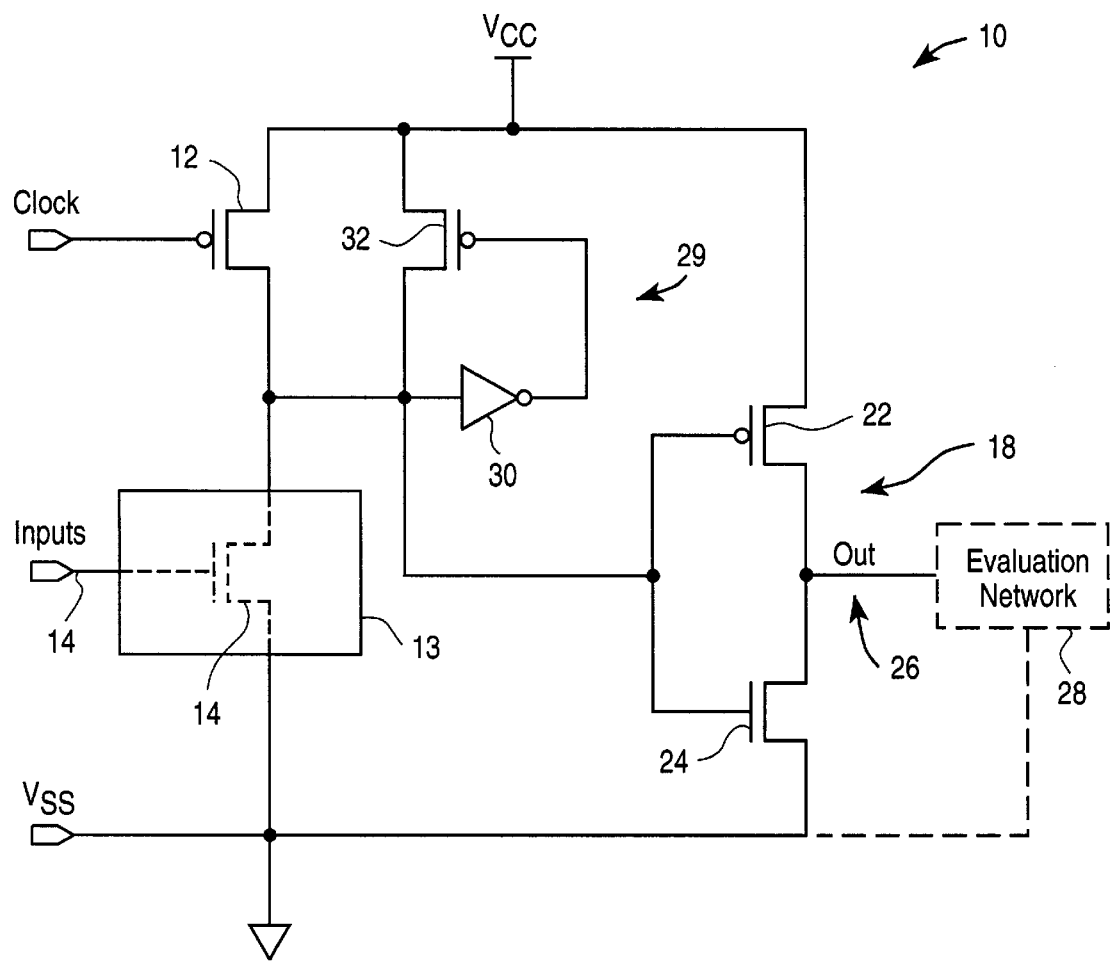
FIG. 1 is a circuit diagram of a prior art domino logic gate.

While the invention is susceptible to various modifications and alternative forms, specific embodiments thereof have been shown by way of example in the drawings and are herein described in detail. It should be understood, however, that the description to herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
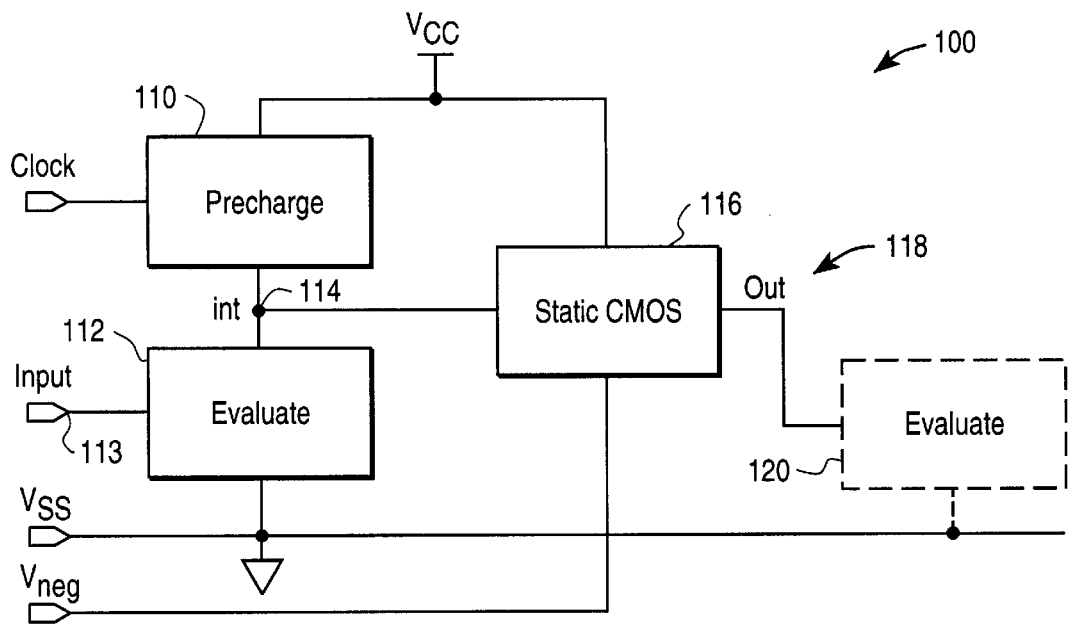
FIG. 2 is a block diagram of a domino logic circuit in accordance with an embodiment of the present invention.

FIG. 2 illustrates a simplified block diagram of a domino logic gate 100 in accordance with an embodiment of the present invention. In general, the domino logic gate 100 includes a clocked precharge stage 110 coupled between a voltage source $V_{cc}$ and an evaluation network 112. The evaluation network 112 is coupled to at least one input 113 and to a common voltage rail $V_{ss}$. The junction between the precharge stage 110 and the evaluation network 112 forms an intermediate node 114. A static CMOS stage 116 is coupled to the intermediate node 114 and the voltage source $V_{cc}$. Further, the static CMOS stage 116 is coupled to a negative voltage rail $V_{neg}$. The static CMOS stage 116 includes an output terminal that may be coupled to an input terminal of an evaluation network 120 of a succeeding domino logic gate.

Figure 3:
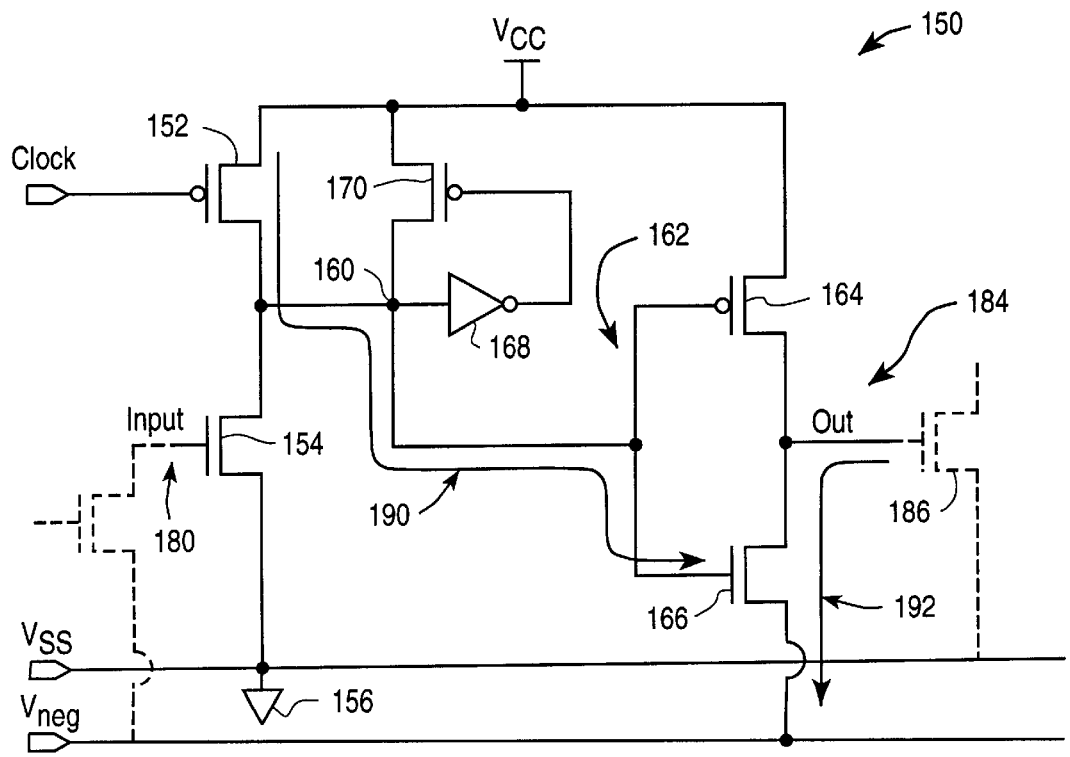
FIG. 3 is a circuit diagram of a domino logic circuit in accordance with an embodiment of the present invention.

In FIG. 3, a circuit diagram of one embodiment of a domino logic gate 150 in accordance with the present invention is illustrated. The exemplary domino logic gate 150 includes a precharge PMOS transistor 152 coupled to a positive voltage rail $V_{cc}$. An NMOS evaluation transistor 154 is coupled between the precharge PMOS transistor 152 and a common ground rail $V_{ss}$. FIG. 3 indicates that the $V_{ss}$ voltage rail is tied to the substrate by showing a ground connection 156 coupled to the line. The NMOS evaluation transistor 154 represents an evaluation network (see reference 112 in FIG. 2) that typically comprises a plurality of NMOS transistors configured to perform a given logic function. Replacing the NMOS evaluation transistor 154 with an evaluation network configured to perform a given logic function would be a routine undertaking for one skilled in the art having the benefit of this disclosure.

An intermediate node 160 is located at the junction of the precharge PMOS transistor 152 and the NMOS evaluation transistor 154. A static CMOS stage 162 is coupled to the intermediate node 160. The static CMOS stage 162 includes a PMOS transistor 164 and an NMOS transistor 166 arranged to form an inverter, with the PMOS transistor 164 coupled to the positive voltage rail $V_{cc}$ and the NMOS transistor 166 coupled to a negative voltage rail $V_{neg}$. The PMOS transistor 164 and the NMOS transistor 166 may be replaced by a single static CMOS gate; this would be a routine undertaking for one skilled in the art.

The exemplary embodiment of the domino logic gate 150 illustrated in FIG. 3 further includes a keeper circuit comprising an inverter 168 and a PMOS transistor 170. The keeper circuit functions to hold the state of the intermediate node 160. The keeper circuit is not essential to the operation of the present invention. Further, other keeper circuits may be employed.

As discussed in the Background of the Invention section, domino gates are typically cascaded. Thus, the NMOS evaluation transistor 154 includes an input terminal 180 that is coupled to the output terminal of a preceding domino gate, represented by a single NMOS transistor 182. The NMOS transistor 182 represents a portion of the static CMOS stage of the preceding domino gate. Therefore, it is coupled to the negative voltage rail $V_{neg}$ as is the static CMOS stage 162 of the domino logic gate 150. Further, an output terminal 184 of the domino logic gate 150 is coupled to the input terminal of the evaluation network of a succeeding domino gate, shown as a single NMOS evaluation transistor 186 coupled to the common voltage $V_{ss}$.

Since the NMOS transistor 166 of the static CMOS stage 162, and similarly, the NMOS transistor 182 of the preceding domino gate, are coupled to the negative voltage rail $V_{neg}$, the inputs to the NMOS evaluation transistors 154, 186 are biased lower than $V_{ss}$ (at $V_{neg}$). FIG. 3 illustrates the precharge path 190, 192 for the output terminal 184. During the precharge portion of the clock cycle (clock logically low), the precharge PMOS transistor 152 turns on, providing a path from the positive voltage rail $V_{cc}$ to the NMOS transistor 166 of the static CMOS stage 162, shown by an arrow labeled with reference 190. This turns the NMOS transistor 166 on, providing a discharge path (reference 192) from the output terminal 184 to the negative voltage rail $V_{ss}$ through the NMOS transistor 166. The input terminal 180 discharges in a similar fashion through the NMOS transistor 182 of the preceding domino gate, biasing the input terminal 180 of the NMOS evaluation transistor 154 lower than $V_{ss}$.

The negative voltage at the input terminal 180 reduces the leakage in the NMOS evaluation transistor 154, thereby improving static power consumption. Moreover, an improved noise margin is seen at the input terminal 180 by the amount of the negative bias. For example, assume that the threshold voltage is reduced by a given amount, $\Delta V$. This would have the effect of degrading the noise margin of the NMOS evaluation transistor 154. This degradation is recovered by setting the negative voltage $V_{neg}$ to $-\Delta V$. As the slope rate at the input terminal 180 is unchanged, the turn-on time for the NMOS evaluation transistor 154 remains unchanged.

Figure 4:
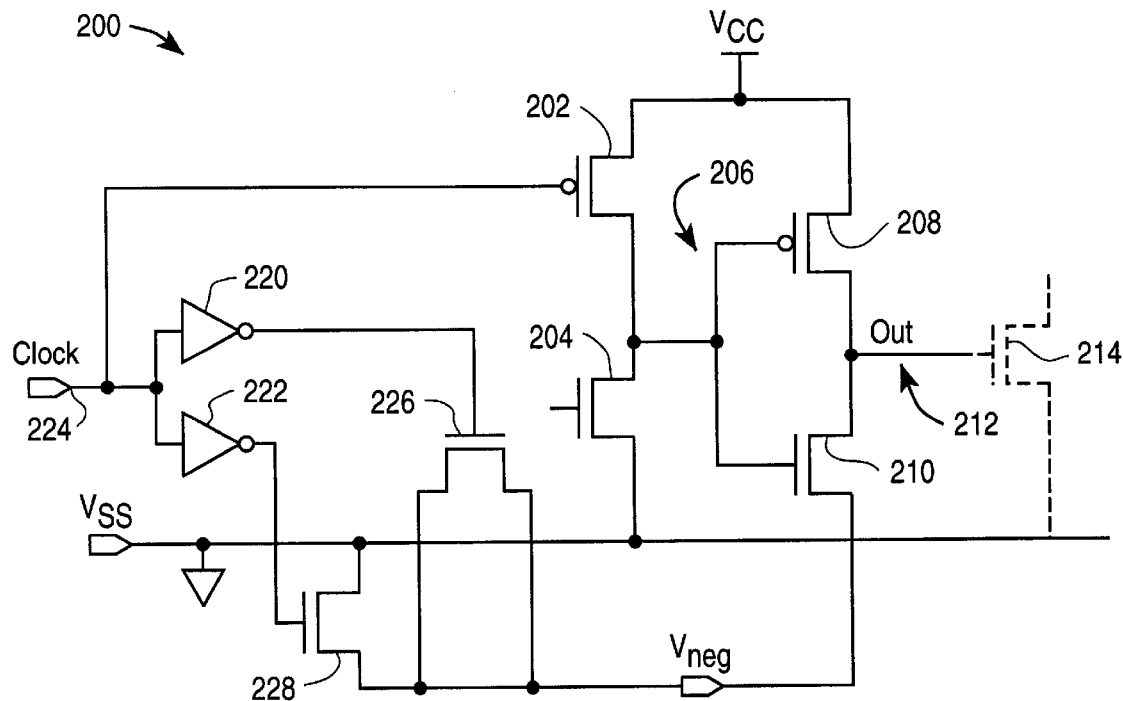
FIG. 4 is a circuit diagram of one embodiment of a domino logic circuit in accordance with the present invention.

FIG. 4 illustrates an exemplary domino logic gate 200 including a negative rail generator in accordance with an embodiment of the invention. The domino logic gate 200 includes a clocked PMOS precharge transistor 202 coupled between a positive voltage source $V_{cc}$ and an NMOS evaluation transistor 204. As in FIG. 3, the NMOS evaluation transistor 204 represents an evaluation network configured to implement a predetermined logic function. The NMOS evaluation transistor 204 is coupled to a common voltage rail $V_{ss}$. A static CMOS stage 206 implements an inverter comprising a to PMOS transistor 208 coupled to the positive voltage source $V_{cc}$ and an NMOS transistor 210 coupled to a negative voltage rail $V_{neg}$. The static CMOS stage 206 further includes an output terminal 212 shown coupled to the input of an NMOS evaluation transistor 214 of a succeeding domino gate, which is coupled to the common voltage rail $V_{ss}$.

The exemplary domino logic gate 200 further has a negative rail generator that is includes first and second inverters 220, 222, each coupled to a clock input terminal 224.

The clock input terminal 224 is common with the domino PMOS precharge transistor clock. An output terminal of the first inverter 220 is coupled to a gate terminal of an NMOS transistor 226, and the NMOS transistor 226 has its source and drain terminals coupled to the negative voltage rail $V_{neg}$. An NMOS transistor 228 is coupled between the common voltage rail $V_{ss}$ and the negative voltage rail $V_{neg}$, with the gate terminal of the NMOS transistor 228 coupled to the output terminal of the second inverter 222.

Figure 5:
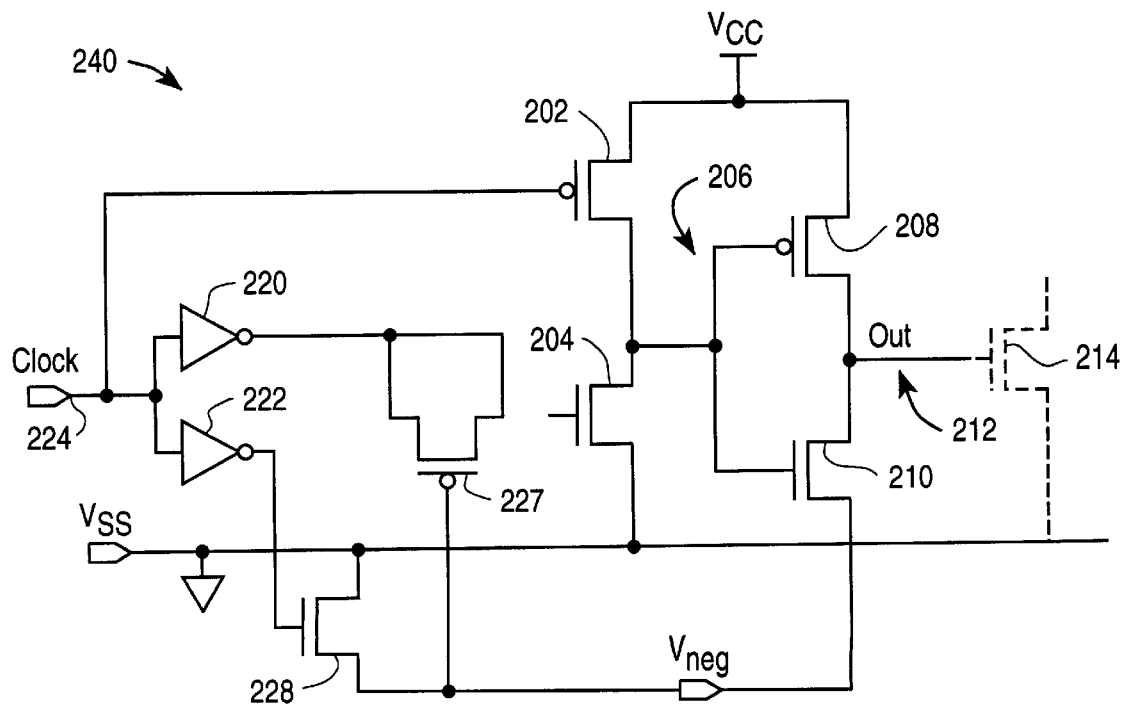
FIG. 5 is a circuit diagram of another embodiment of a domino logic circuit in accordance with the present invention.

FIG. 5 illustrates an alternate embodiment of the domino logic gate 200 of FIG. 4. The domino logic gate 240 illustrated in FIG. 5 is essentially identical to the domino logic gate 200 of FIG. 4, except the negative voltage generator includes a PMOS transistor 227 in place of the NMOS transistor 226 of FIG. 4. In FIG. 5, the PMOS transistor 227 has its gate terminal coupled to the negative voltage rail $V_{neg}$, and its gate and source terminals both coupled to the output of the first inverter 220.

Figure 6:
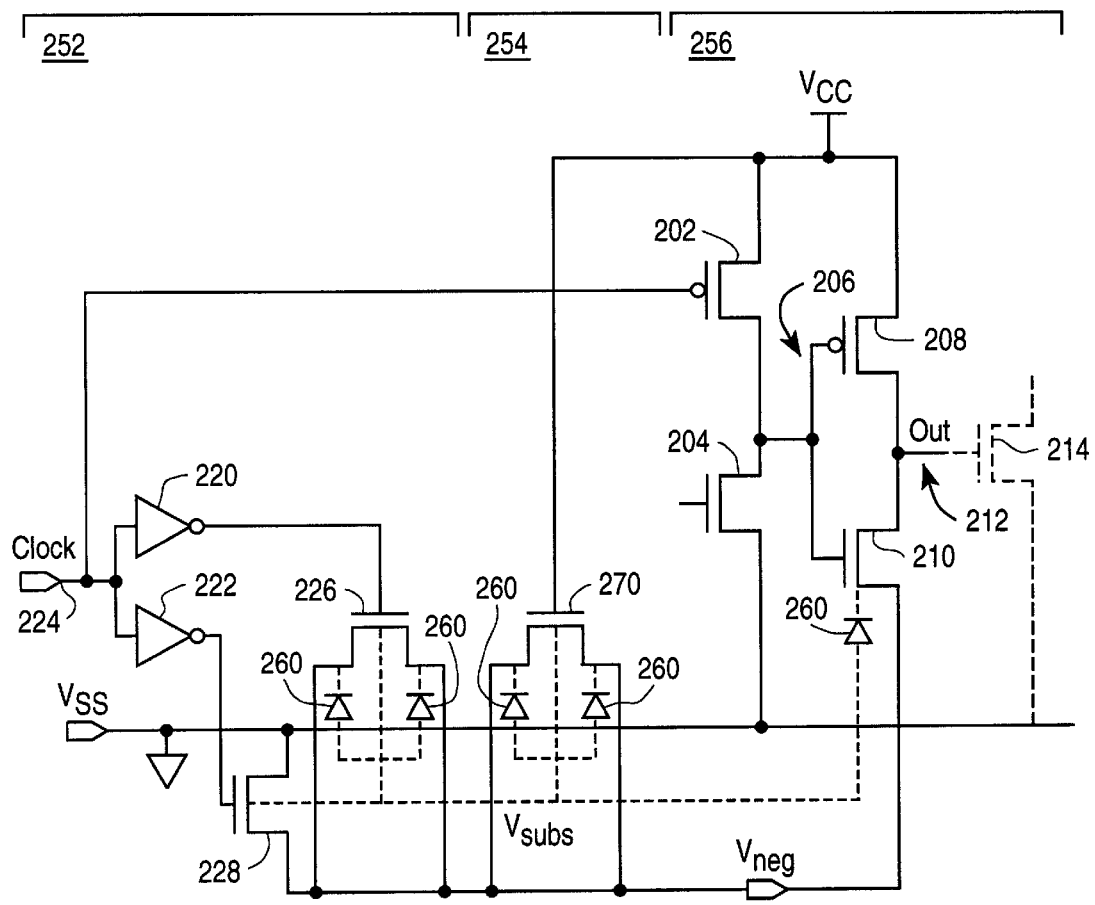
FIG. 6 is a circuit diagram of yet another embodiment of a domino logic circuit in accordance with the present invention.

Yet another domino logic gate 250 in accordance with an embodiment of the invention is illustrated in FIG. 6. The domino logic gate 250 of FIG. 6 is essentially identical to the domino logic gate 200 of FIG. 4, further including a charge storage section 254. Thus, the domino logic gate 250 includes a negative rail generator section 252, the charge storage section 254 and a domino section 256. In addition, FIG. 6 illustrates source to substrate diodes 260. The negative rail generator section 252 and the domino section 256 are as illustrated in FIG. 4, and the same reference numerals have been used to refer to like components. As with the embodiment illustrated in FIG. 4, the NMOS transistor 226 in the negative rail generator section 252 may be replaced with a PMOS transistor (reference 227 in FIG. 5). The charge storage section 254 includes an NMOS transistor 270 having its gate terminal coupled to the positive voltage source $V_{cc}$ and its source and drain terminal coupled to the negative voltage rail $V_{neg}$.

When the clock 224 is logically low (the precharge stage), the NMOS transistor 228 of the negative rail generator 252 and the NMOS transistor 210 of the static CMOS section 206 are both on. This discharges the output terminal 212 (the input to NMOS transistor 214) to the negative voltage rail $V_{neg}$ through the NMOS transistor 210. Since the NMOS transistor 228 is also on, it shorts the negative rail $V_{neg}$ to the common rail $V_{ss}$, and the discharge currents from the output terminal 212 are bypassed to the common voltage rail $V_{ss}$. With the clock 224 at a logically low level, the output of the first inverter 220 is logically high; thus, the gate capacitor ($C_{g1}$) of the NMOS transistor 226 is charged to the supply voltage $V_{CC}$. The charge stored is calculated according to $$Q_{store} = V_{cc} \times C_{g1}$$

When the clock goes logically high, the domino stage 256 enters the evaluation mode. If the input signal to the NMOS evaluation transistor 204 is logically high, the PMOS transistor 208 turns on and the NMOS transistor 210 is driven off. Thus, the output terminal 212 evaluates to a logic high. Alternatively, if the input signal to the NMOS evaluation transistor 204 is logically low, the PMOS transistor 208 remains off and the NMOS transistor 210 remains off, as it was in the precharge phase. In either case, little or no discharge current flows into the negative rail $V_{neg}$ during the evaluate phase.

The NMOS transistor 228 is turned off by the logically low output signal from the second inverter 222 (inverting the logically high clock signal). The first and second inverters 220, 222 may be sized such that the NMOS transistor 228 turns off rapidly, before the output of the first inverter 220 begins to fall in response to the clock 224 going high. Appropriately sizing the first and second inverters 220, 222 for a particular application is within the skill in the art. The falling voltage at the output terminal of the first inverter 220 transfers the charge stored across the NMOS transistor 226 (or the PMOS transistor 227, as appropriate) to the negative voltage rail $V_{neg}$, driving it negative.

The source to substrate diodes 260 of the devices on the negative rail $V_{neg}$ prevent the negative voltage rail $V_{neg}$ from being driven too far negative. In one embodiment, for instance, with an applied 400 mV substrate bias, the maximum negative voltage $V_{neg}$ is limited to under 200 mV because of the diodes 260 of the NMOS transistor 226 being forward biased. The capacitors storing a charge are referenced in the following table.

TABLE 1

| Device | Reference |
| --- | --- |
| NMOS transistor 226 | $C_{g1}$ |
| NMOS transistor 270 | $C_{g2}$ |
| NMOS transistor 204 | $C_{g3}$ |
| NMOS transistor 214 | $C_{g4}$ |
| Source-drain | $C_s$ |

The charge redistribution on the various capacitors gives:

$$Q_{store} = V_{neg} \times (C_{g1} + C_{g2} + C_{g3} + C_{g4} + C_s)$$

Thus, the negative voltage may be expressed as:

$$V_{neg} = V_{cc} \times \left( \frac{C_{g1}}{C_{g1} + C_{g2} + C_{g3} + C_{g4} + C_s} \right)$$

Solving for $C_{g1}$, the required capacitance of the gate capacitor of the NMOS transistor 226 ($C_{g1}$) can be estimated as $$C_{g1} = (C_{g2} + C_{g3} + C_{g4} + C_s) \times \left( \frac{V_{neg}}{V_{cc} - V_{neg}} \right)$$

Since $V_{neg}$ is a small fraction of $V_{cc}$ (about 100 mV for $V_{cc}=1.3$ V), the required capacitance of $C_{g1}$ is small.

The above explanation is simplified for illustration purposes. If the NMOS transistor 226 is used in the negative rail generator 252, the developed negative voltage is slightly higher because of the NMOS transistor 252 moving into cutoff and the capacitance being smaller than $C_{g1}$. On the other hand, a PMOS device, such as the PMOS transistor 227, retains the same value of $C_{g1}$, with the higher capacitance giving greater regulation on the rail. Source-drain capacitances (combined and expressed as $C_s$) are also voltage dependent and have been assumed constant.

In some applications, sufficient leakage may exist such that $V_{neg}$ will not remain negative for long periods of time. However, the clock cycle is typically fast enough to prevent losing the negative charge on $V_{neg}$. Some current may flow into the negative rail $V_{neg}$ when the inverter of the static CMOS stage 206 switches upon evaluation. In typical domino logic gates, the static CMOS stage 206 is strongly skewed, with the NMOS transistor 210 being significantly smaller than the PMOS transistor 208. Thus, any current flowing into the negative rail $V_{neg}$ due to the switching of the static CMOS stage 206 would be small.

The falling gate of the NMOS transistor 210 of the static CMOS stage 206 may cause a charge previously stored across the gate capacitor of the NMOS transistor 210 to distribute into the negative voltage rail $V_{neg}$ and the succeeding domino gate. This would bootstrap the negative rail $V_{neg}$ in the direction of the gate of the NMOS transistor 210, resulting in the negative voltage on the negative rail $V_{neg}$ going further negative. There are several factors that may mitigate this condition. For instance, the regulation of the negative voltage rail $V_{neg}$ improves as the effective capacitance on the negative rail $V_{neg}$ increases. Adding the charge storage stage 254 and using the PMOS transistor 227 increase capacitance, and thus, improves regulation of the negative voltage rail $V_{neg}$.

One simulation of a particular circuit in accordance with an embodiment of the invention indicated that the negative voltage developed is dependent primarily on the supply voltage $V_{cc}$, while the degradation in negative voltage depends mainly on temperature (leakage increases with temperature). The negative voltage developed in one particular embodiment varied from −80 mV to −130 mV for supply voltages $V_{cc}$ from 1.04 V to 1.3 V and temperatures varying from 0 to 110° C. In a simulation including a chain of 12 gates, bootstrap effects with every gate discharging resulted in $V_{neg}$ being driven further negative by approximately 7 mV.

Further, with the particular embodiments of the negative voltage generator illustrated in FIG. 4, FIG. 5 and FIG. 6, ordinarily, gates from the same clock phase should be driven on a given negative voltage rail $V_{neg}$. In other words, with the negative voltage generator as illustrated, gates normally should not be actively precharging while other gates are simultaneously in their evaluate stage. For a stable negative voltage $V_{neg}$ to be developed, it is desirable to eliminate current in the negative rail $V_{neg}$ when domino gates are in the evaluation phase.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. For example, the negative voltage supply rail may be implemented using circuit embodiments other than those disclosed herein. Accordingly, the protection sought herein is as set forth in the claims below.

What is claimed is:

1. A domino circuit, comprising:
   a clocked precharge stage coupled to a positive voltage rail, the precharge stage having an input terminal;
   an evaluation network having at least one input terminal and being coupled between the precharge stage and a common voltage rail;
   a static CMOS stage coupled to the positive voltage rail, the static CMOS stage having an input terminal and an output terminal, the input terminal being coupled to a junction formed by the precharge stage and the evaluation network; and
   a negative voltage rail coupled to the static CMOS stage to precharge the output terminal to a negative voltage.

2. The domino circuit of claim 1, wherein the static CMOS stage output terminal is coupled to an input terminal of an evaluation network of a succeeding domino circuit.

3. The domino circuit of claim 1, wherein the input terminal of the evaluation network is coupled to an output terminal of a preceding domino circuit.

4. The domino circuit of claim 1, wherein the clocked precharge stage comprises a PMOS transistor having a gate terminal coupled to a clock that provides clock pulses of alternating logic levels.

5. The domino circuit of claim 1, wherein the evaluation network comprises a plurality of NMOS transistors arranged to implement a given logic function.

6. The domino circuit of claim 1, further comprising a circuit configured to generate the negative voltage on the negative voltage rail.

7. The domino circuit of claim 6, wherein the circuit configured to generate the negative voltage comprises at least one voltage storage device coupled to the negative voltage rail, such that the voltage storage device charges during a portion of a clock signal.

8. The domino circuit of claim 7, wherein the at least one voltage storage device comprises an NMOS transistor having a gate terminal coupled to the clock signal through an inverter, and a source terminal and a drain terminal each coupled to the negative voltage rail.

9. The domino circuit of claim 7, wherein the at least one voltage storage comprises a PMOS transistor having a gate terminal coupled to the negative voltage rail, and a source terminal and a drain terminal each coupled to the clock signal through an inverter.

10. The domino circuit of claim 7 wherein the at least one voltage storage device comprises first and second transistors, the first transistor coupled between the clock signal and the negative voltage rail, and the second transistor coupled between the positive voltage rail and the negative voltage rail.

11. The domino circuit of claim 7, further comprising a switching device coupled between the negative voltage rail and the common voltage rail, such that the switching device allows current to flow into the voltage storage device during a first portion of the clock signal and allows the voltage storage device to discharge during a second portion od the clock signal.

12. The domino circuit of claim 11, wherein the switching device comprises a transistor having a gate terminal coupled to the clock signal.

13. The domino circuit of claim 12 wherein the transistor comprises an NMOS transistor and wherein the gate terminal is coupled to the clock signal through an inverter.

14. A domino circuit comprising:

a clocked precharge stage coupled to a positive voltage source;

an evaluation network including at least one input terminal, the evaluation network coupled between the precharge stage and ground forming a junction between the precharge stage and the evaluation network;

a static CMOS stage coupled to the positive voltage source and having an input and an output, the input being coupled to the junction; and means for biasing the input terminal negative.

15. A method for precharging a domino logic circuit including at least one output terminal, the method comprising the act of precharging the output terminal to a negative voltage.

16. A method for operating a domino logic circuit, comprising the acts of:

receiving a clock signal;

charging an input node of a static CMOS stage to a first preselected voltage level during a first portion of the clock signal;

coupling an output terminal of the static CMOS stage to a negative voltage supply in response to the input node being charged to the first preselected voltage level;

receiving an input signal during a second portion of the clock signal;

pulling the input node to a second preselected voltage level in response to the input signal being of a first preselected type; and charging the output node to the first preselected voltage level in response to the input node being at the second preselected voltage level.

17. The method of claim 16 further comprising the acts of:

charging a voltage storage device during the first portion of the clock signal; and discharging the voltage storage device to the negative voltage supply during the second portion of the clock signal.

18. A domino logic network, comprising:

a clock signal;

a positive voltage rail;

a common voltage rail;

a negative voltage rail;

a plurality of domino logic gates, each gate including:
    a precharge device coupled to the positive voltage rail and having an input terminal coupled to the clock signal,
    an evaluation network coupled between the precharge device and the common voltage rail, the evaluation network having at least one input terminal, and
    a static CMOS stage coupled between the positive voltage rail and the negative voltage rail, the static CMOS stage having an input terminal coupled to the evaluation network and including an output terminal;

wherein the output terminal of a first one of the domino logic gates is coupled to one of the evaluation network inputs of a second one of the domino logic gates.

19. The domino logic network of claim 18, further comprising at least one voltage storage device coupled to the negative rail.

20. The domino logic network of claim 19 further comprising a switching device coupled between the negative voltage rail and the common voltage rail.

21. The domino logic network of claim 20 wherein the switching device includes an input terminal coupled to the clock signal.

* * * * *